United States Patent
Chiba

(10) Patent No.: US 7,603,510 B2
(45) Date of Patent: Oct. 13, 2009

(54) SEMICONDUCTOR DEVICE AND STORAGE CELL HAVING MULTIPLE LATCH CIRCUITS

(75) Inventor: Satoshi Chiba, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 189 days.

(21) Appl. No.: 11/393,859

(22) Filed: Mar. 31, 2006

(65) Prior Publication Data
US 2006/0242364 A1    Oct. 26, 2006

(30) Foreign Application Priority Data
Apr. 11, 2005    (JP)    .............................. 2005-113932

(51) Int. Cl.
G06F 12/00 (2006.01)
G11C 5/02 (2006.01)
G11C 11/34 (2006.01)
G11C 11/4063 (2006.01)

(52) U.S. Cl. .............................. 711/3; 711/118; 365/49; 365/51; 365/52; 365/63; 365/154; 365/189.05; 365/230.06

(58) Field of Classification Search ....................... None
See application file for complete search history.

(56) References Cited

U.S. PATENT DOCUMENTS 5,602,797 A * 2/1997 Kang ..................... 365/230.06
2007/0133314 A1 * 6/2007 Chae ....................... 365/189.05

FOREIGN PATENT DOCUMENTS

JP    04090196 A  *  3/1992
JP    10-335992      12/1998

* cited by examiner

Primary Examiner—Jack A Lane
(74) Attorney, Agent, or Firm—McGinn IP Law Group, PLLC

(57) ABSTRACT

A semiconductor storage device including a first latch circuit for latching stored data and a storage cell part including a plurality of second latch circuits that operate with inverted logic from the first latch circuit and receives the stored data from the first latch circuit to output the received data using the second latch circuit selected in accordance with a selection signal.

19 Claims, 12 Drawing Sheets

SEMICONDUCTOR DEVICE AND STORAGE CELL HAVING MULTIPLE LATCH CIRCUITS

BACKGROUND OF THE INVENTION

1. Field of the Invention

The present invention relates to a semiconductor storage device and a cache memory. In particular, the invention relates to a semiconductor storage device capable of high-speed operation, and a cache memory including the same.

2. Description of Related Art

In recent years, there is an increasing demand to reduce a chip size of a semiconductor device such as a microcomputer with the aim of saving costs. In general, the microcomputer or the like includes a cache memory for temporarily storing data used in a processor. The cache memory is required to allow high-speed access even with a small capacity.

FIG. 6A shows a typical cache memory. In FIG. 6A, a cache memory 600 is connected with a processor 601 and an external memory, and includes a cache controller 610, a data RAM (Random Access Memory) 611, a valid bit memory 612 for storing Valid Bit, a dirty bit memory 613 for storing Dirty Bit, a tag memory 614, and a comparator 615.

A processor 601 processes data. The cache controller 610 controls data writing/reading between an external main memory and the cache memory 600. The data RAM 611 is a memory for storing the data proceed by the processor 601. The Valid Bit is one-bit data representing whether or not data stored in the data RAM 611 is valid. The valid bit memory 612 is a memory for storing the one-bit data. The Dirty Bit is one-bit data representing whether or not the data stored in the data RAM 611 is changed as a result of the processing of the processor 601. The dirty bit memory 613 is a memory for storing the one-bit data. A tag memory 614 is a memory for storing information about which address of the main memory corresponds to the data stored in the data RAM 611. A detailed description of the tag memory 614 is given below. The comparator 615 sends a signal representing the result of determining whether or not data is stored on the data RAM 611 based on the data received from the valid bit memory 612, the tag memory 614, and the processor 601 to the cache controller 610.

That is, the main memory has an address identifying a location of data, and address information is added to the data transferred from the main memory. In order for the processor 601 to process correct data, data on the cache memory 600 needs to match data on the main memory. The cache memory 600 checks whether or not data on the main memory matches data on the cache memory based on the address data, the Valid Bit, and the Dirty Bit. However, storing the information used for checking the data together with writing/reading data in the data RAM 611 hinders the efficient use of the data RAM 611 with a small capacity. To that end, the information used for checking the data is stored in the tag memory 614 specialized to an address data structure. The structure of the tag memory 614 is specialized to the address data structure, whereby the tag memory 614 enables higher access speed with a smaller footprint than the data RAM 611.

The cache memory 600 is connected with an external main memory through the cache controller 610. If the data RAM 611 has not stored same data as data with an address of the main memory which is required by the processor 601, the cache controller 610 outputs a Write Data signal for controlling data writing to the data RAM 611 to bring the data RAM 611 into a write enable state. After that, the cache controller 610 sends data (Cache Full Data) with the address of the main memory, which is required by the processor 601 to the data RAM 611 of the cache memory 600. In this way, the data on the main memory matches the data in the cache memory 600, a flag of the Valid Bit is set.

Further, if the data RAM 611 has stored data to be processed by the processor 601, the processor 601 executes processing using the data on the data RAM 611. The Dirty Bit is set in the cache memory 600 for determining whether or not data is changed as a result of the processing of the processor 601. If the data on the data RAM 611 is changed after being processed by the processor, a flag of the Dirty Bit is set. The cache controller 610 receives the changed data (Write Back Data) on the data RAM 611 based on the flag, and transfers the received data to the main memory.

When requiring data necessary for processing, the processor 601 sends address data for specifying an address of the requested data on the main memory. The address data sent from the processor includes tag address data and Index address data. The tag address data accounts for several upper bits of the address data. Further, the Index address data accounts for several lower bits of the address data. The tag memory 614 stores tag address data associated with the Index address data when a WriteTag signal as a write control signal from the cache controller 610 is at a write enable state. On the other hand, if the WriteTag signal from the cache controller 610 is at a write disable state, the tag memory 614 sends tag address data associated with the received Index address data.

The tag address data output from the tag memory 614 is input to the comparator 615. The comparator 615 sends a Hit signal if the tag address data from the tag memory 614 matches the tag address data from the processor 601, and the flag of the Valid Bit is set, that is, the data RAM 611 has stored objective data; otherwise, the comparator 615 sends a Miss Hit signal.

In summary, the cache memory 600 can instantly pass the data to the processor 601 if the data in the incorporated data RAM 611 matches the data on the main memory. The cache memory 600 and the processor 601 are mounted on the same semiconductor substrate or the cache memory 600 is connected with the processor 601 through a high-speed interface, so the processor 601 can access the cache memory 600 at an operating frequency higher than that of the external main memory. In other words, since frequently used data is stored in the cache memory 600, a processing speed of the entire system can be increased.

As a system of storing an address of data in the tag memory and controlling data on the data RAM in the cache memory, there are various systems such as a direct-mapped cache system and a set associative system. In any system, the tag memory functions to store tag address data and output the stored tag address data.

FIG. 6B shows a relation among the address data, the tag memory, and the data memory in accordance with the direct-mapped cache system. The address data sent from the processor includes tag address data and Index address data. The tag address data represents an address of an upper layer in the target address, for example, page number. The Index address data represents an address of a lower layer in the target address, for example, a line on the page specified by the tag address data. The tag memory 614 and the data RAM 611 includes as many memories as Index addresses. The Index address of the tag memory 614 is associated with the Index address of the data RAM 611.

When address data is sent from the processor 601, the tag memory 614 references the Index address data in the sent address data. The tag memory 614 output tag data corresponding to the referenced Index address data. After that, the tag address data of the address data sent from the processor 601 is compared with the tag address data read from the tag memory 614, and the Valid Bit associated with the Index address data is computed. As a result, if the tag address data on the tag memory 614 matches the tag address data from the processor 601, and the flag of the Valid Bit is set, a Hit signal is output. The cache memory 600 sends data corresponding to the Index address from the data RAM 611 based on the Hit signal.

An SRAM (Static RAM) or a memory using a flip flop is hitherto used as a typical tag memory. The SRAM used as the tag memory is described as the Related Art 1. Further, the memory having the flip flop as the tag memory is described as the Related Art 2.

FIG. 7A shows an SRAM 700a as the tag memory of the Related Art 1. The SRAM 700a of FIG. 7A is a circuit that receives the Index address data, the WriteTag signal, the tag address data, and clocks, and outputs tag data based on the received data and signal.

FIG. 8A is a timing chart of operations of the SRAM 700a as the tag memory of the Related Art 1. The SRAM 700a as the tag memory operates with a RAM's clock as an inverted a system clock in order to complete its operation with the system clock of one cycle.

First, an operation of writing the tag address data is described. If the WriteTag signal is at a write enable state, the SRAM 700a fetches a tag address at a timing T2 in step with a rising edge of the RAM's clock.

Next, an operation of reading the tag address data is described. If the WriteTag signal is at a write disable state, the SRAM 700a fetches tag address data in step with a rising edge of the RAM's clock at a timing T6, and outputs the data with a predetermined delay. Then, information about a result of comparing the tag address data from SRAM 700a with the tag data from the processor 601 is supplied to the cache controller 610 at a timing T7.

FIG. 7B shows a tag memory 700b using a flip flop of the Related Art 2. The tag memory 700b using a flip flop enables higher operating frequency than that of the SRAM 700a. Japanese Unexamined Patent Application Publication No. H10-335992 discloses an example of the flip flop.

The tag memory 700b using a flip flop of the Related Art 2 includes D-FFs (D-flip flops) $710_0$ to $710_N$ (hereinafter collectively referred to as "D-FFs 710), AND gates $720_0$ to $720_N$ (hereinafter collectively referred to as "AND gates 720"), a decoder 730, D latch n731, and a multiplexer 732.

The D-FFs 710 include an input terminal D, an output terminal Q, and a control terminal. The D-FFs 710 are circuits for storing data input to the input terminal D on the rising edge of a signal input to the control terminal as its output. In the Related Art 2, the signal input to the control terminal of the D-FFs 710 is a Masked clock signal controlled by the AND gates 720 that receive clock signals.

In the D-FFs 710, as many D-FFs as the number of bits of the stored tag address data are packaged into one cell, and plural cells are provided in a number corresponding to the number of Index address data. Each of the D-FFs 710 stores tag address data corresponding to the Index address data.

The AND gates 720 include first and second input terminals, and an output terminal. The AND gates 720 are circuits that output a signal of High level, provided that signals of High level (for instance, power supply potential) are input to both of the first and second input terminals; otherwise (when signals of High level are not input to both of the first and second input terminals), a signal of Low level (for instance, ground potential) is output.

The AND gates 720 are provided in a number corresponding to the number of D-FFs 710. The individual AND gates 720 are connected with a corresponding one of the D-FFs 710. A control signal is input to the first input terminal, and a clock is input to the second input terminal. That is, only the AND gates 720 designated by the control signal output a signal of High level in step with the clock. Thus, only the D-FFs 710 based on the Index address data are brought into a write enable state.

The decoder 730 receives Index address data that designates x-th Index address, and a WriteTag signal. The decoder 730 outputs a WETag [N:0] signal of (N+1) bit length for selecting the x-th D-FF 710 to which data is to be written, based on the thus-received address data and signal.

The D latch n731 includes an input terminal D, an output terminal Q, and a control terminal CLK. The D latch n731 is a circuit where a gate is opened to output a signal input to the input terminal D to the output terminal Q while an input voltage of the control terminal CLK is at the Low level. Further, while the input voltage of the control terminal CLK is at the High level, the gate is closed to keep the signal voltage level just before the input voltage of the control terminal CLK is turned to the High level.

The D latch n731 latches the input WETag [N:0] signal to generate an output signal based on the aforementioned operation. The latched signal becomes a control signal as a Latched WETag [N:0] signal of the (N+1) bit length, and is used for selecting the D-FF 710 to which data is written based on the Index address data.

The multiplexer 732 is a circuit for selecting a target D-FF from the D-FFs 710 based on the Index address data. The tag address data stored in the D-FFs 710 is output through the multiplexer 732. Thus, the tag address data stored in the target D-FF 710 is output based on the Index address data.

FIG. 8B is a timing chart of operations of the tag memory of the Related Art 2. First of all, an operation of writing the tag address data is described. In the tag memory 700b using a flip flop, the WETag [N:0] signal is generated between the periods during which the WriteTag signal is at a write enable state, based on the Index address data and the WriteTag signal in the period. As for the generated WETag [N:0] signal is determined by the D latch n731 during a period from the timing T2 to the timing T3, during which a clock is at a Low level. During the period from the timing T2 to the timing T4, the D latch n731 outputs the Latched WETag [N:0] signal. The Latched WETag [N:0] signal is used for selecting one from among the plural D-FFs 710. The selected D-FF 710 stores the tag address data fetched on the rising edge of the clock at the timing T3.

Next, an operation of reading the tag address data is explained. If the Index address data is changed, the tag memory 700b using a flip flop outputs the tag address data stored in the D-FF 710 designated by the Index address data.

In the case of using the tag memory 700b using a flip flop, since data reading can be started from the first half of a clock pulse, the tag memory 700b can use a system clock frequency higher than that of the SRAM 700a.

The tag memory of the Related Art 1 or the Related Art 2 is hitherto used in the cache memory. However, if the SRAM 700a of the Related Art 1 is used for the tag memory 614, the rising edge of the RAM's clock is the falling edge of the clock, so the tag address data is output in the second half of the clock pulse. Moreover, the tag data cannot be output without a predetermined delay from the timing T6. In this case, the maximum clock operating frequency is limited to a value twice or more as long as the delay. That is, it is difficult to increase the operating frequency.

Further, in general, the tag memory 700b using a flip flop of the Related Art 2 increase a layout space for elements larger than the SRAM due to the flip flop. The larger layout space directly leads to an increase in chip cost, and hinders reduction in chip cost.

As discussed above, the conventional techniques have difficulties in realizing a semiconductor storage device that enables high-speed access with a small layout space.

SUMMARY OF THE INVENTION

A semiconductor storage device according to an aspect of the present invention including a first latch circuit for latching stored data and a storage cell part including a plurality of second latch circuits that operate with inverted logic from the first latch circuit and receives the stored data from the first latch circuit to output the received data using the second latch circuit selected in accordance with a selection signal.

According to the present invention, the second latch circuit operates with inverted logic from the first latch circuit, whereby it is possible to store stored data using a latch circuit and read data at high speeds without using a flip flop. In addition, the latch circuit has simpler configuration than the flip flop, and thus occupies only a smaller area in the layout. Thus, a chip area can be saved. Accordingly, an inexpensive tag memory can be realized.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

A semiconductor storage device according to a first embodiment of the present invention is suitably applied to, for example, a memory operable at high speeds with a small capacity such as a tag memory, or a cache memory using the same. Incidentally, this embodiment describes the tag memory and the cache memory including the same by way of example. However, the present invention is not limited thereto, and is also applicable to a dirty bit memory or a valid bit memory, or a cache memory including the same as described below.

Figure 1A:
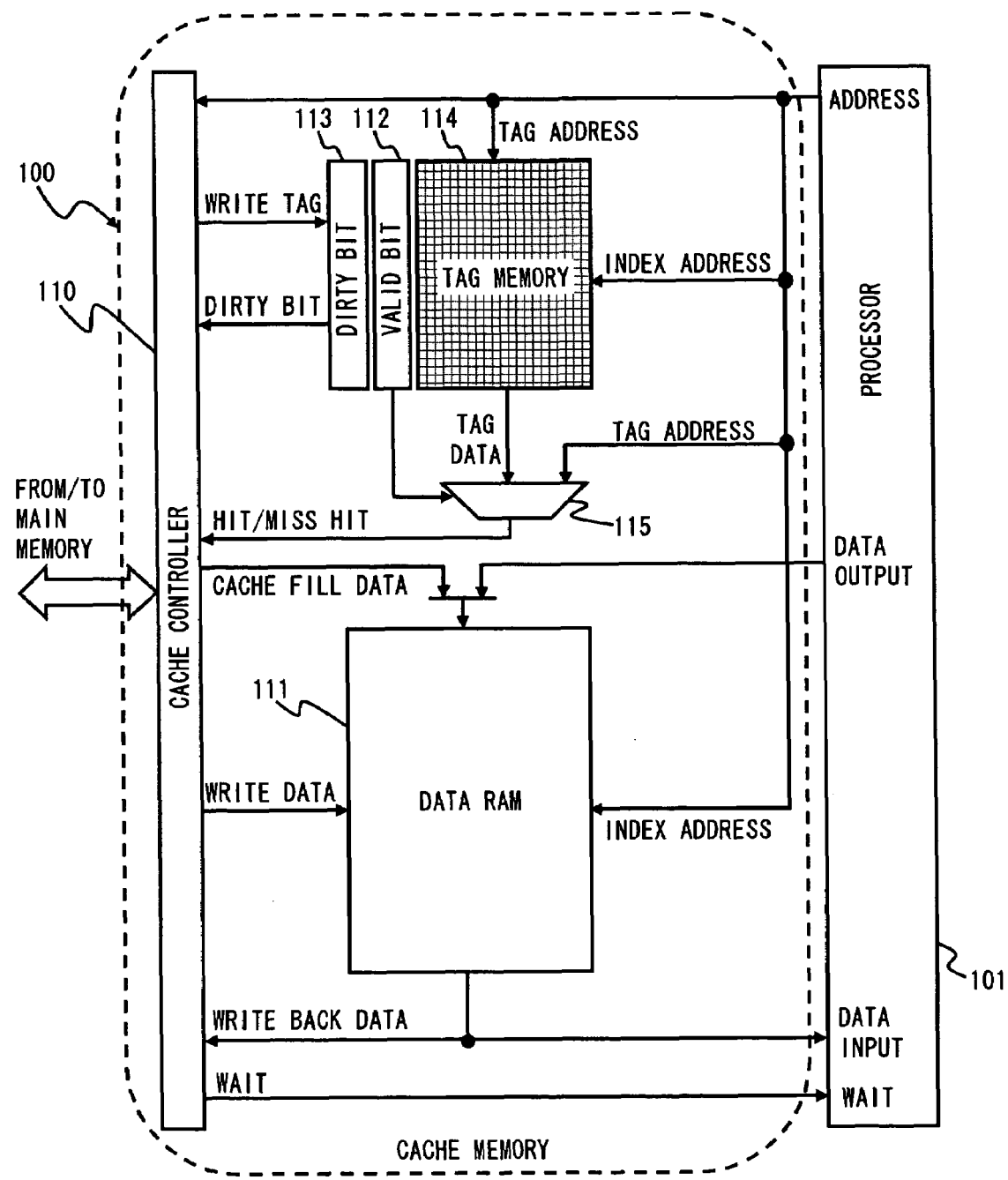
FIG. 1A shows a cache memory according to the present invention.

FIG. 1A shows a cache memory of the first embodiment. The cache memory 100 is connected with a processor 101 and an external memory, and includes a cache controller 110, a data RAM (Random Access Memory) 111, a valid bit memory 112 for storing Valid Bit, a dirty bit memory 113 for storing Dirty Bit, a tag memory 114, and a comparator 115.

The processor 101 processes data. The cache controller 110 controls data writing/reading between an external main memory and the cache memory 100. The data RAM 111 is a memory for storing data to be processed by the processor 101. The Valid Bit is one-bit data representing whether or not data stored in the data RAM 111 is valid. The valid bit memory 112 is a memory for storing the one-bit data. The Dirty Bit is one-bit data representing whether or not the data stored in the data RAM 111 is changed as a result of the processing of the processor 101. The dirty bit memory 113 is a memory for storing the one-bit data. The tag memory 114 is a memory for storing information about which address of the main memory corresponds to the data stored in the data RAM 111. A detailed description of the tag memory 114 is given below. The comparator 115 is a circuit for sending a signal representing the result of determining whether or not data is stored on the data RAM 111 based on the data received from the valid bit memory 112, the tag memory 114, and the processor 101 to the cache controller 110.

The main memory has an address identifying a location of data, and address information is added to the data transferred from the main memory. In order for the processor 101 to process correct data, data on the cache memory 100 needs to match data on the main memory. The cache memory 100 checks whether or not data on the main memory matches data on the cache memory based on the address data, the Valid Bit, and the Dirty Bit. However, storing the information used for checking the data together with writing/reading data in the data RAM 111 hinders the efficient use of the data RAM 111 with a small capacity. To that end, the information used for checking the data is stored in the tag memory 114 specialized to an address data structure. The structure of the tag memory 114 is specialized to the address data structure, whereby the tag memory 114 enables higher access speed with a smaller footprint than the data RAM 111.

The cache memory 100 is connected with an external main memory through the cache controller 110. If the data RAM 111 has not stored same data as data with an address of the main memory which is required by the processor 101, the cache controller 110 outputs a Write Data signal for controlling data writing to the data RAM 111 to bring the data RAM 111 into a write enable state. After that, the cache controller 110 sends data (Cache Full Data) with the address of the main memory, which is required by the processor 101 to the data RAM 111 of the cache memory 100. In this way, the data on the main memory matches the data in the cache memory 100, a flag of the Valid Bit is set.

Further, if the data RAM 111 has stored data to be processed by the processor 101, the processor 101 executes processing using the data on the data RAM 111. The Dirty Bit is set in the cache memory 100 for determining whether or not data is changed as a result of the processing of the processor 101. If the data on the data RAM 111 is changed after being processed by the processor, a flag of the Dirty Bit is set. The cache controller 110 receives the changed data (Write Back Data) on the data RAM 111 based on the flag, and transfers the received data to the main memory.

When requiring data necessary for processing, the processor 101 sends address data for specifying an address of the requested data on the main memory. The address data sent from the processor includes tag address data and Index address data. The tag address data accounts for several upper bits of the address data. For example, the tag address data is stored data. Further, the Index address data accounts for several lower bits of the address data. For example, the Index address data is designating data. The tag memory 114 stores tag address data associated with the Index address data when a WriteTag signal as a write control signal from the cache controller 110 is at a write enable level. The tag memory 114 sends tag address data associated with the received Index address data.

The tag address data output from the tag memory 114 is input to the comparator 115. The comparator 115 sends a Hit signal if the tag address data from the tag memory 114 matches the tag address data from the processor 101, and the flag of the Valid Bit is set, that is, the data RAM 111 has stored objective data; otherwise, the comparator 115 sends a Miss Hit signal.

In summary, the cache memory 100 can instantly pass the data to the processor 101 if the data in the incorporated data RAM 111 matches the data on the main memory. The cache memory 100 and the processor 101 are mounted on the same semiconductor substrate or the cache memory 100 is connected with the processor 601 through a high-speed interface, so the processor 101 can access the cache memory 100 at an operating frequency higher than that of the external main memory. In other words, since frequently used data is stored in the cache memory 100, a processing speed of the entire system can be increased.

As a system of storing an address of data in the tag memory and controlling data on the data RAM in the cache memory, there are various systems such as a direct-mapped cache system and a set associative system. In any system, the tag memory functions to store tag address data and output the stored tag address data.

Figure 1B:
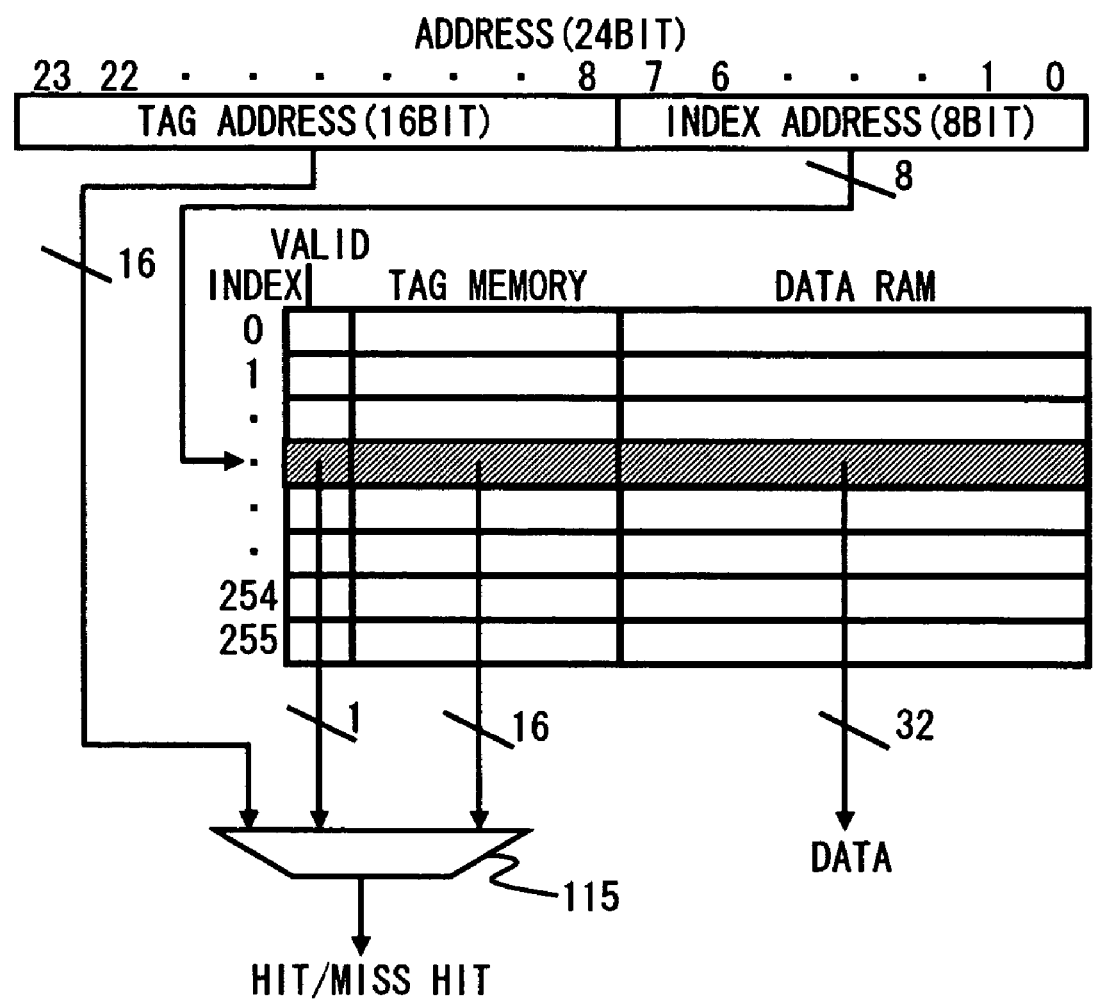
FIG. 1B shows the cache memory according to the present invention.

FIG. 1B shows a relation among the address data, the tag memory, and the data memory in accordance with the direct-mapped cache system. The address data sent from the processor includes tag address data and Index address data. The tag address data represents an address of an upper layer in the target address, for example, page number. The Index address data represents an address of a lower layer in the target address, for example, a line on the page specified by the tag address data. The tag memory 614 and the data RAM 111 includes as many memories as Index addresses. The Index address of the tag memory 114 is associated with the Index address of the data RAM 111.

When address data is sent from the processor 101, the tag memory 114 references the Index address data in the sent address data. The tag memory 114 output tag data corresponding to the referenced Index address data. After that, the tag address data of the address data sent from the processor 101 is compared with the tag address data read from the tag memory 114, and the Valid Bit associated with the Index address data is computed. As a result, if the tag address data on the tag memory 114 matches the tag address data from the processor 101, and the flag of the Valid Bit is set, a Hit signal is output. The cache memory 100 sends data corresponding to the Index address from the data RAM 111 based on the Hit signal.

Figure 2:
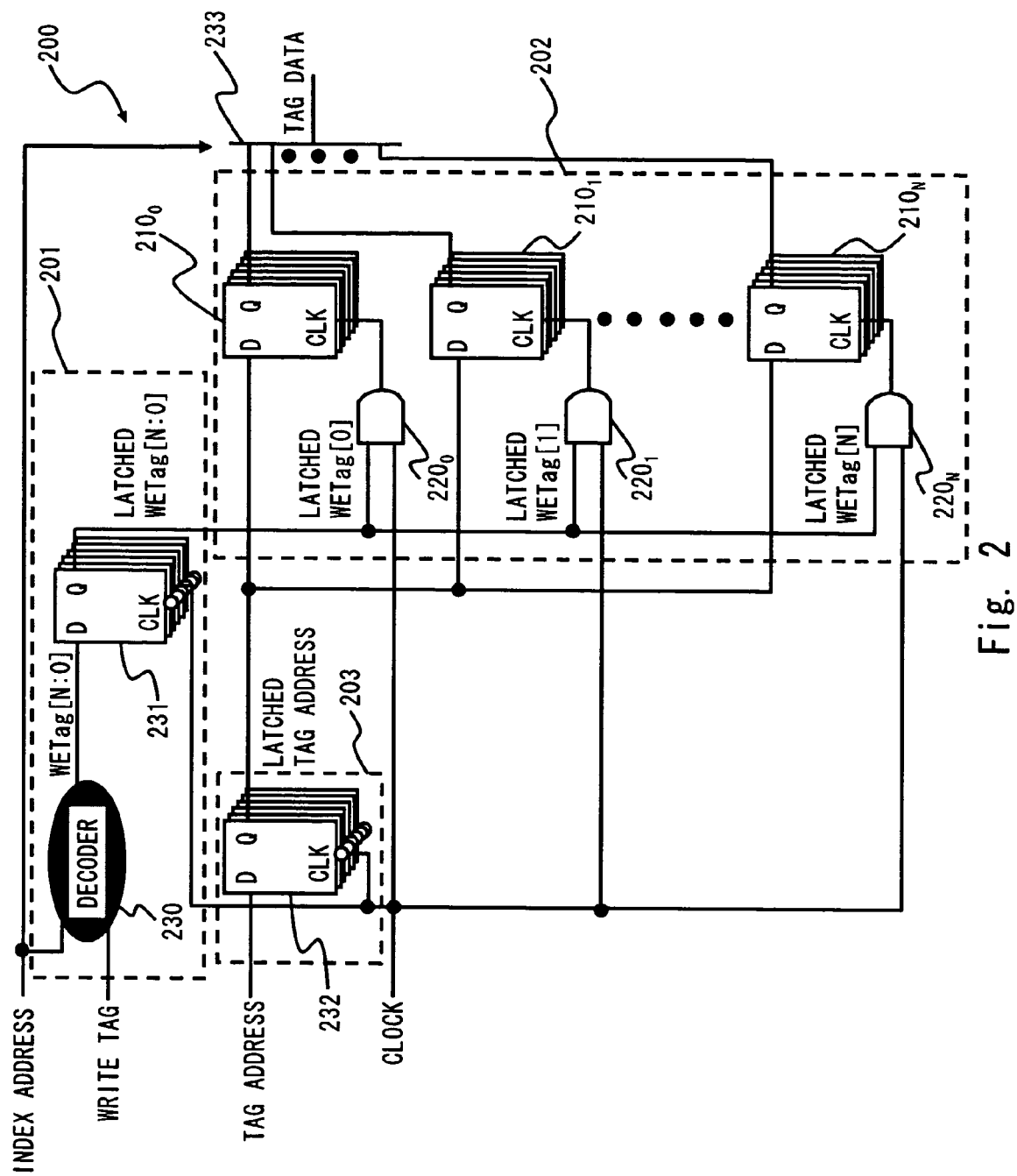
FIG. 2 shows a tag memory according to a first embodiment of the present invention.

FIG. 2 shows a tag memory 200 of the first embodiment. The tag memory 200 of the first embodiment includes a selection signal generating circuit 201, a storage cell part 202, a latch circuit 203, and a multiplexer 233.

In the embodiments of the present invention, a D latch referred to as D latch p opens a gate to send out an input signal as an output signal while a control signal is at the High level (for example, power supply potential), and closes the gate while the control signal is at the Low level (for example, ground potential) to keep and output a value of an input signal just before the gate is closed. A D latch that operates with inverted logic from the D latch p is referred to as a D latch n.

The selection signal generating circuit 201 includes a decoder 230, and D latch 231 (for example, third latch circuit) The storage cell part 202 includes D latches p210.sub.0 to 210.sub.N (hereinafter collectively referred to as "D latches p210") and AND gates 220.sub.0 to 220.sub.N (hereinafter collectively referred to as "AND gates 220"). In this embodiment, the D latches p210 are used as, for example, a second latch circuit. As many D latches p as the number of bits of the stored tag address data are packaged into one cell, and plural cells are provided in a number corresponding to the number of Index address data. In addition, as many AND gates 220 as the cells of the D latches p210 are provided. The latch circuit 203 includes the D latch n232 (for example, first latch circuit).

In the tag memory of the first embodiment, the selection signal generating circuit 201 generates a WETag [N:0] signal of (N+1) bit length for selecting the x-th D latch p210 based on Index address data that designates x-th Index address, and a WriteTag signal. The decoder 230 outputs a WETag [N:0] signal of (N+1) bit length for selecting the x-th D latch p210 to which data is to be written, based on the thus-received address data and signal, latches the WETag [N:0] signal, and generates a (N+1)-bit Latched WETag [N:0] signal. The WETag [N:0] signal is an asynchronous selection signal that changes not in sync with a clock supplied to the tag memory. Further, the Latched WETag [N:0] signal is a selection signal latched in sync with a clock.

The latch circuit 203 latches the tag address data to generate Latched tag address data. The storage cell part 202 generates a Masked clock using the AND gates 220 based on a clock signal and the above Latched WETag [N:0] signal. The Masked clock is a clock signal sent to the x-th D latch p210 designated by the Index address data representing the x-th address. The D latches p210 that are brought into a write enable state in accordance with the Masked clock store the above Latched tag address data.

The multiplexer 233 is a circuit for selecting and outputting signals of the D latch p210 designated by the Index address data.

How to connect components of the tag memory 200 of the first embodiment is described in more detail. The D latch n232 includes an input terminal D, an output terminal Q, and a control terminal CLK. While a clock signal supplied to the control terminal CLK is at the Low level, the D latch n232 outputs tag address data input to the input terminal D as the Latched tag address data of the output terminal Q. On the other hand, while a clock signal supplied to the control terminal CLK is at the High level, the tag address data input to the input terminal D just before the clock signal is turned to the High level is held as the Latched tag address data of the output terminal Q.

The D latches p210 includes an input terminal D, an output terminal Q, and a control terminal CLK. While a signal supplied to the control terminal CLK is at the High level, the D latches p210 output the tag address data input to the input terminal D from the output terminal Q. On the other hand, while a signal supplied to the control terminal CLK is at the Low level, the tag address data input to the input terminal D just before the signal is turned to the Low level is held as output data. Here, the N (0th to Nth) D latches p210 are provided, and N corresponds to the number of Index address data. The individual D latches p210 stores data corresponding to each Index address. The tag address data is stored data to be stored in the tag memory.

The decoder 230 receives the Index address data and the WriteTag signal. The decoder 230 outputs a WETag [N:0] signal that brings a tag memory cell designated by the Index address data into a write enable state, and brings the other tag memory cells into a write disable state. The Index address data is designating data for designating the Index address of the address data. The WriteTag signal is a control signal for determining whether or not to bring the D latches p210 into a write enable state.

The D latch n232 includes an input terminal D, an output terminal Q, and a control terminal CLK. While a clock signal supplied to the control terminal CLK is at the Low level, the D latch n232 outputs the WETag [N:0] signal input to the input terminal D from the output terminal Q as the Latched WETag [N:0] signal. The Latched WETag [N:0] signal designates the D latches p210 to/from which the tag address data is written or read. Further, while a clock signal supplied to the control terminal CLK is at the High level, the WETag [N:0] signal input to the input terminal D just before the clock is turned into the High level is held as the Latched WETag [N:0] signal of the output terminal Q.

The AND gates 220 include first and second input terminals and an output terminal. While the Latched WETag [N:0] signal input to the first input terminal is at the High level, and the clock signal supplied to the second input terminal is at the High level, the AND gates 220 output the signal of the High level. Further, while signals supplied to the first and second input terminals are both at the Low level or at different levels, the signal of the Low level is output from the output terminal. Further, the AND gates 220 are provided in a number corresponding to the number of D latches p, and outputs of the individual AND gates 220 are connected with the control terminal CLK of a corresponding one of the D latches p210. The x-th AND gate 220 selected in accordance with the Latched WETag [N:0] signal generated based on the Index address data representing the x-th address outputs the Masked clock. That is, the Masked clock is a clock supplied to the selected D latch p210 only during the selection period.

The multiplexer 233 is a circuit that is connected with outputs of the D latches p210, and selects and outputs data output from the D latch p210 selected in accordance with the input Index address data.

Figure 3:
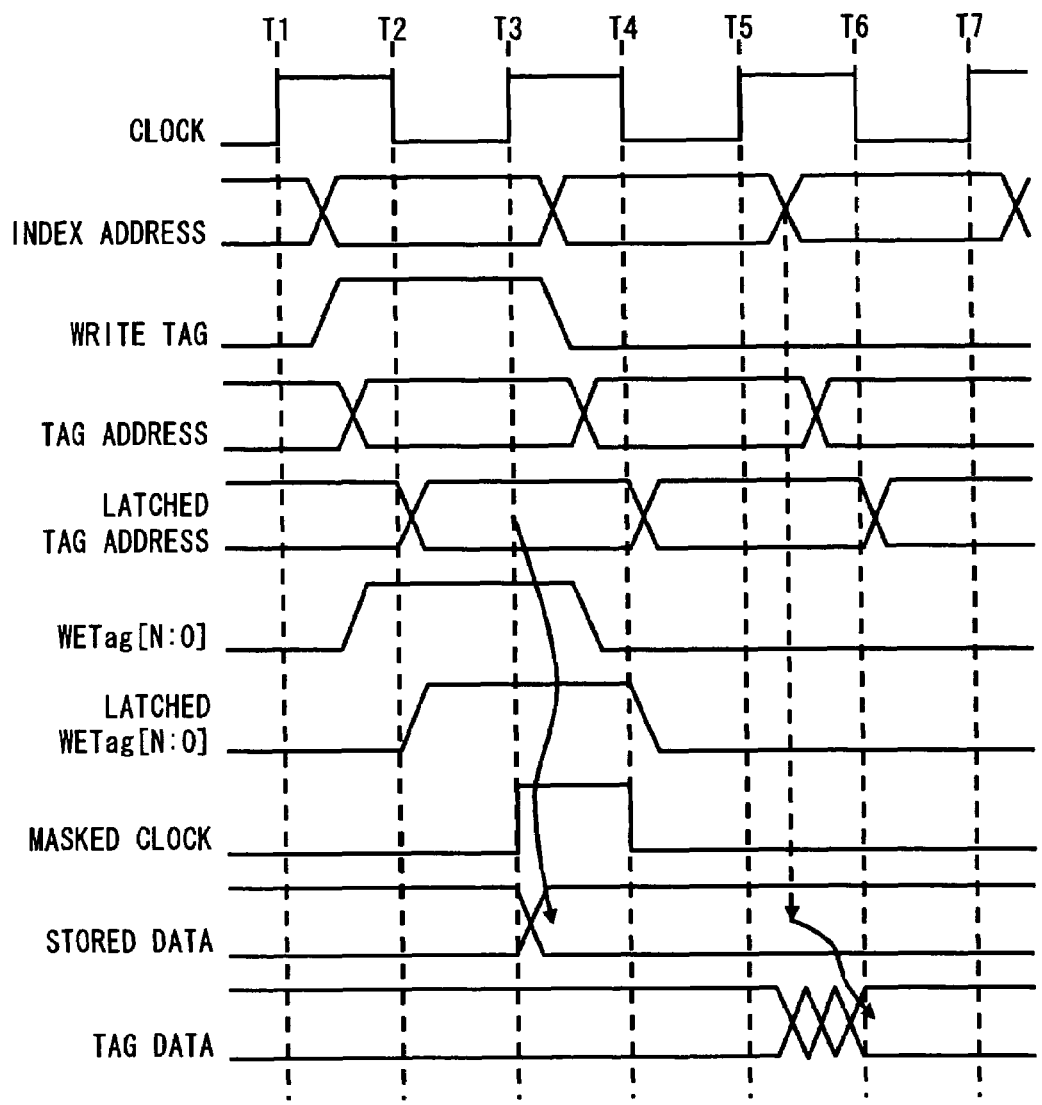
FIG. 3 is a timing chart of an operation of the tag memory according to the first embodiment of the present invention.

FIG. 3 is a timing chart showing operations of the tag memory 200 of the first embodiment. First, an operation of writing the tag address data is described. As shown in FIG. 3, the WriteTag signal is shifted to a write enable state during a period from the timing T1 to the timing T2. Hence, the decoder 230 generates the WETag [N:0] signal based on the Index address data and the WriteTag signal. The WETag [N:0] signal is output as the Latched WETag [N:0] signal from the D latch n232 on the falling edge of the clock at the timing T2. The Latched WETag [N:0] signal is held until when the falling edge of the clock appears during a period from the timing T2 to the timing T4.

Further, the input tag address data is output from the D latch n232 on the falling edge at the timing T2. This output data is input to the D latches p210 as the Latched tag address data. The Latched tag address data is held until when the falling edge of the clock appears during a period from the timing T2 to the timing T4.

When the clock rises at the timing T3, the AND gate 220 designated by the Latched WETag [N:0] signal outputs the Masked clock. The D latch p210 connected to the designated AND gate 220 starts outputting the Latched tag address data determined at the timing T3 on the rising edge of the Masked clock, and stores the Latched tag address data just before the falling edge of the clock at the timing T4.

Next, an operation of reading the tag address data is described. If the Index address data is changed during a period from the timing T5 to the timing T6, the D latch p210 selected by the multiplexer 233 based on the Index address data is switched to the other D latch p210. At this time, since the WriteTag signal is at a write disable state, the D latches p210 do not execute data storage. Thus, after the Index address data has changed, the tag address data based on the Index address data is output from the multiplexer 233. That is, a period from the change of the Index address data to the change in data output from the multiplexer 233 is a delay period of the multiplexer 233, and does not depend on the change in clock.

According to the tag memory 200 of the first embodiment, data reading can be started from the first half of a clock pulse similar to the conventional tag memory having the D-FF. Hence, the tag address data can be read from the tag memory 200 at high speeds.

Further, in general SRAMs, it is necessary to collectively lay out elements in a predetermined capacity, but in the D latch p and the D latch n, the elements can be individually laid out, so the degree of freedom in layout is higher than the SRAM. That is, the elements can be laid out in a gap between blocks on the chip, which enables the design with the high degree of freedom in consideration of a chip area.

Further, the number of transistors of the D latch p and the D latch n is smaller than the number of transistors of the D-FF, so elements can be respectively laid out in a small area. For example, provided that the footprint of the tag memory composed of the D-FFs is 100, the footprint of the tag memory composed of the D latch p and the D latch n with the same capacity is about 70.

According to tag memory of the first embodiment, it is possible to realize a tag memory that enables high-speed access even with the small footprint.

Second Embodiment

Figure 4:
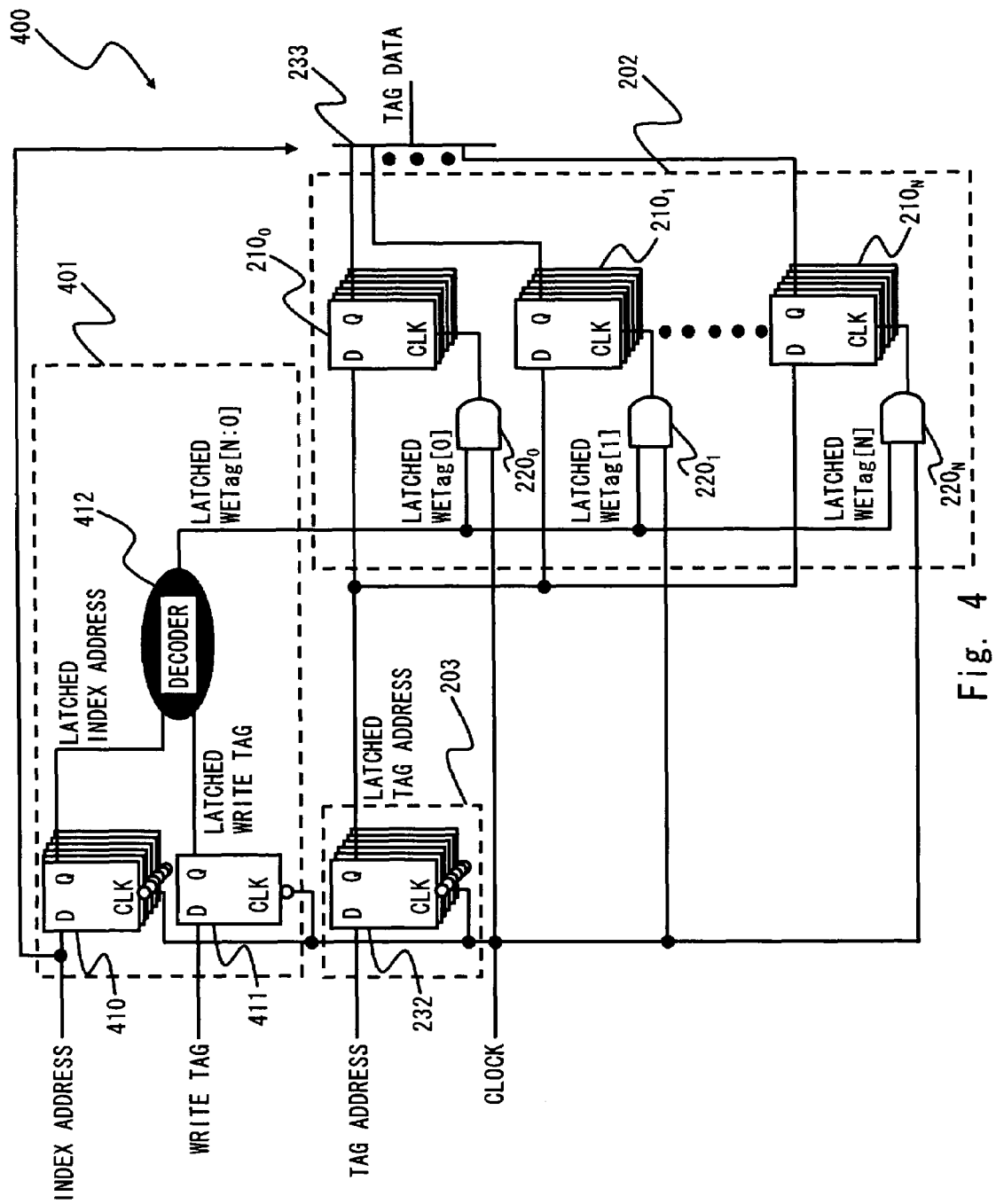
FIG. 4 shows a tag memory according to a second embodiment of the present invention.

A tag memory according to a second embodiment is used in the above cache memory, for example, similar to the tag memory of the first embodiment. FIG. 4 shows a tag memory 400 according to the second embodiment. Referring to FIG. 4, the tag memory 400 of the second embodiment has the same output and input as those of the tag memory 200 of the first embodiment, in which the input data is sent out as the output data. That is, the tag memory 200 of the first embodiment differs from the tag memory 400 of the second embodiment only in terms of components of the selection signal generating circuit. Accordingly, the same components as those of the first embodiment are denoted by like reference numerals, and a description thereof is omitted here.

A selection signal generating circuit 401 of the tag memory 400 of the second embodiment includes a D latch n410 as a forth latch circuit, a D latch n411 as a fifth latch circuit, and a decoder 412. The D latch n410 latches the Index address data and generates the Latched Index address signal. The D latch n411 latches the WriteTag signal to generate a Latched WriteTag signal. The decoder 412 generates the Latched WETag [N:0] signal based on the Latched Index address data and the Latched WriteTag signal. The Latched WETag [N:0] signal is a selection signal for selecting the D latch p210 to which the tag data is written, based on the Index address data representing the x-th Index address.

That is, the selection signal generating circuit 401 generates the Latched WETag [N:0] signal of the (N+1)-bit length as a selection signal based on the Index address data and the WriteTag signal. Thus, the operation of the selection signal generating circuit 401 of the second embodiment is similar to that of the selection signal generating circuit 201 of the first embodiment.

In addition, the second embodiment is the same as the first embodiment in that the selection signal generating circuit 401 receives the Index address data and the WriteTag signal, and generates and inputs a selection signal to the AND gates 220 of the storage cell part 202.

Figure 5:
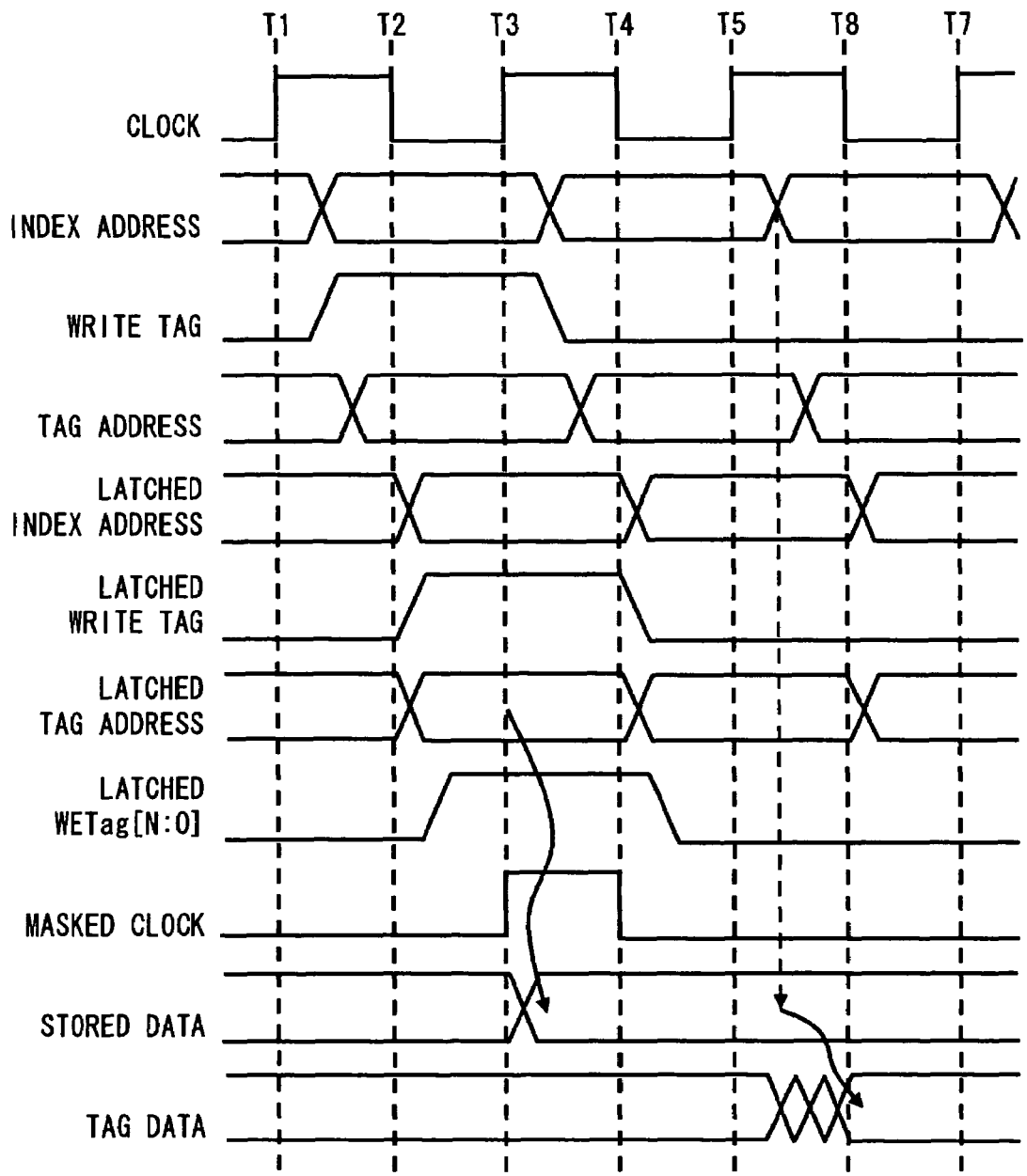
FIG. 5 is a timing chart of an operation of the tag memory according to the second embodiment of the present invention.
Figure 6A:
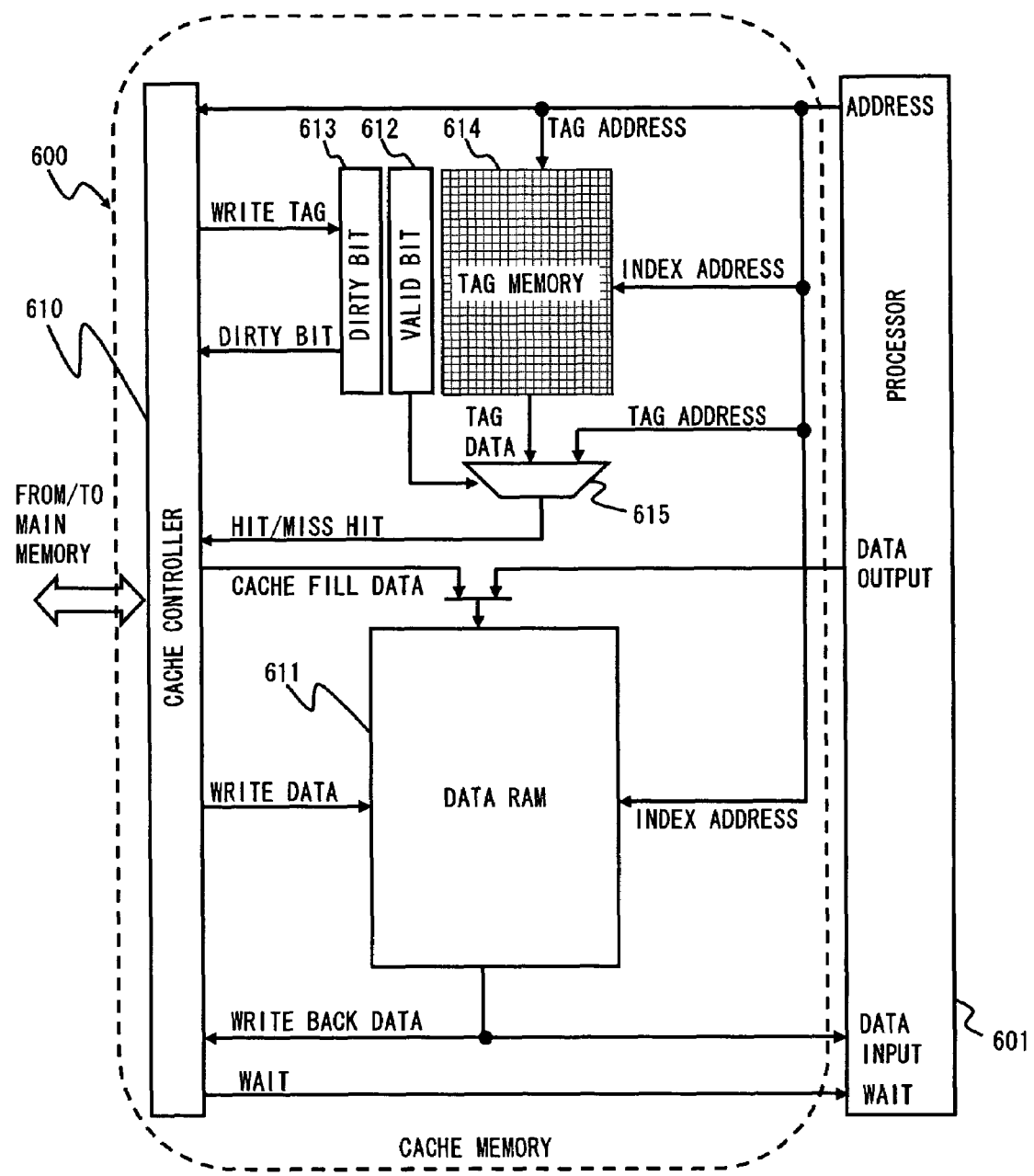
FIG. 6A shows a general cache memory.
Figure 6B:
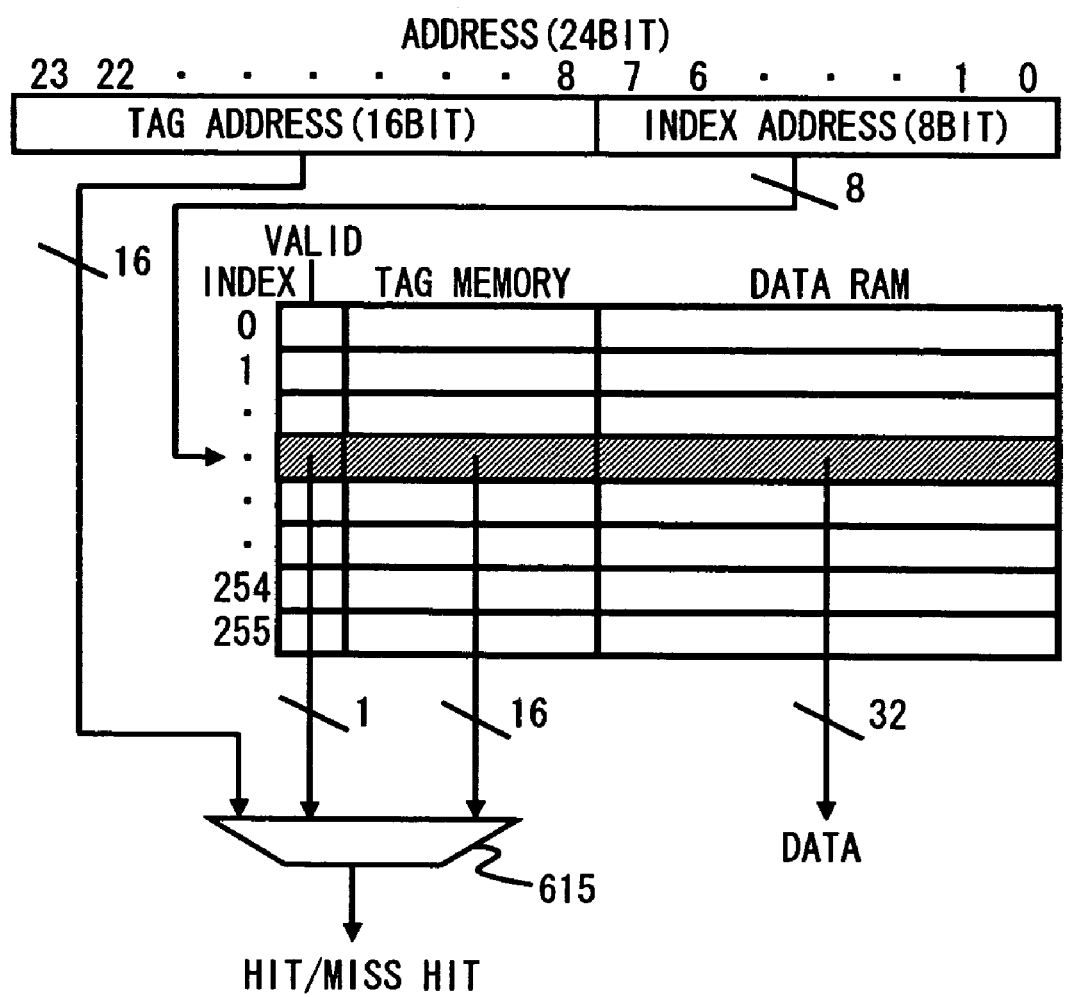
FIG. 6B shows a general tag memory.
Figure 7A:
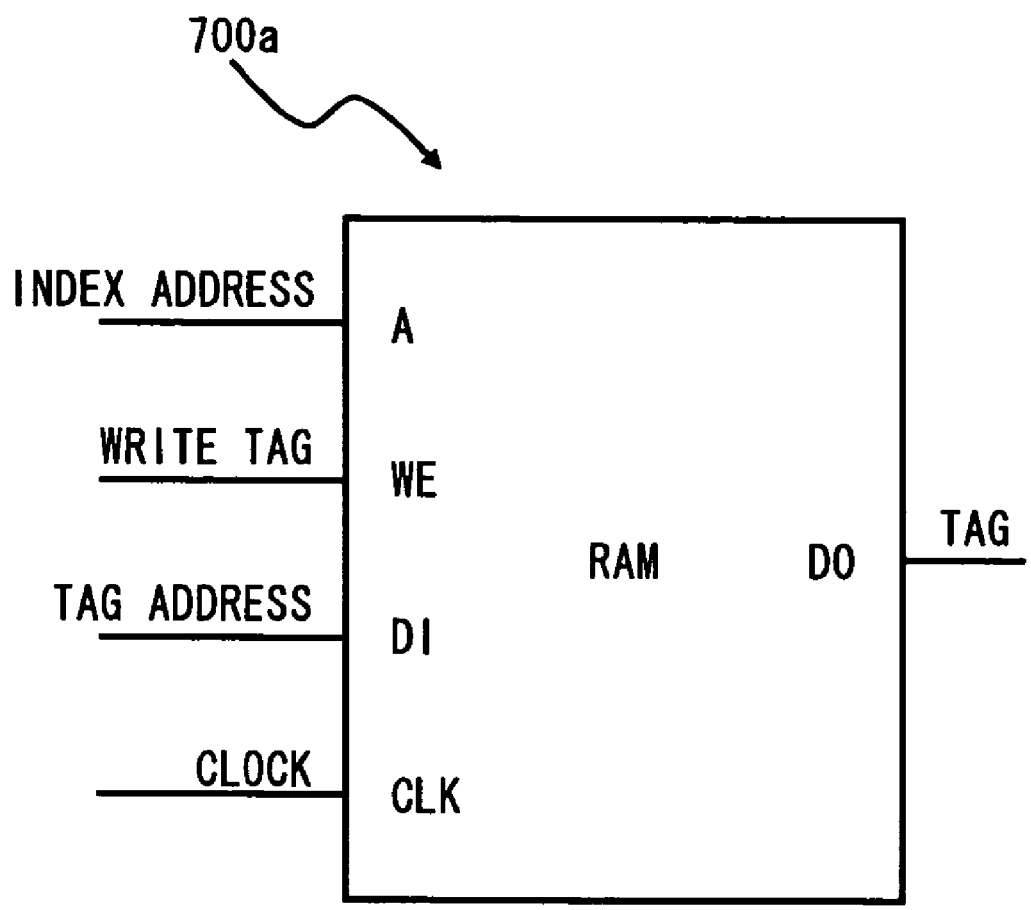
FIG. 7A shows a conventional SRAM used as a tag memory.
Figure 7B:
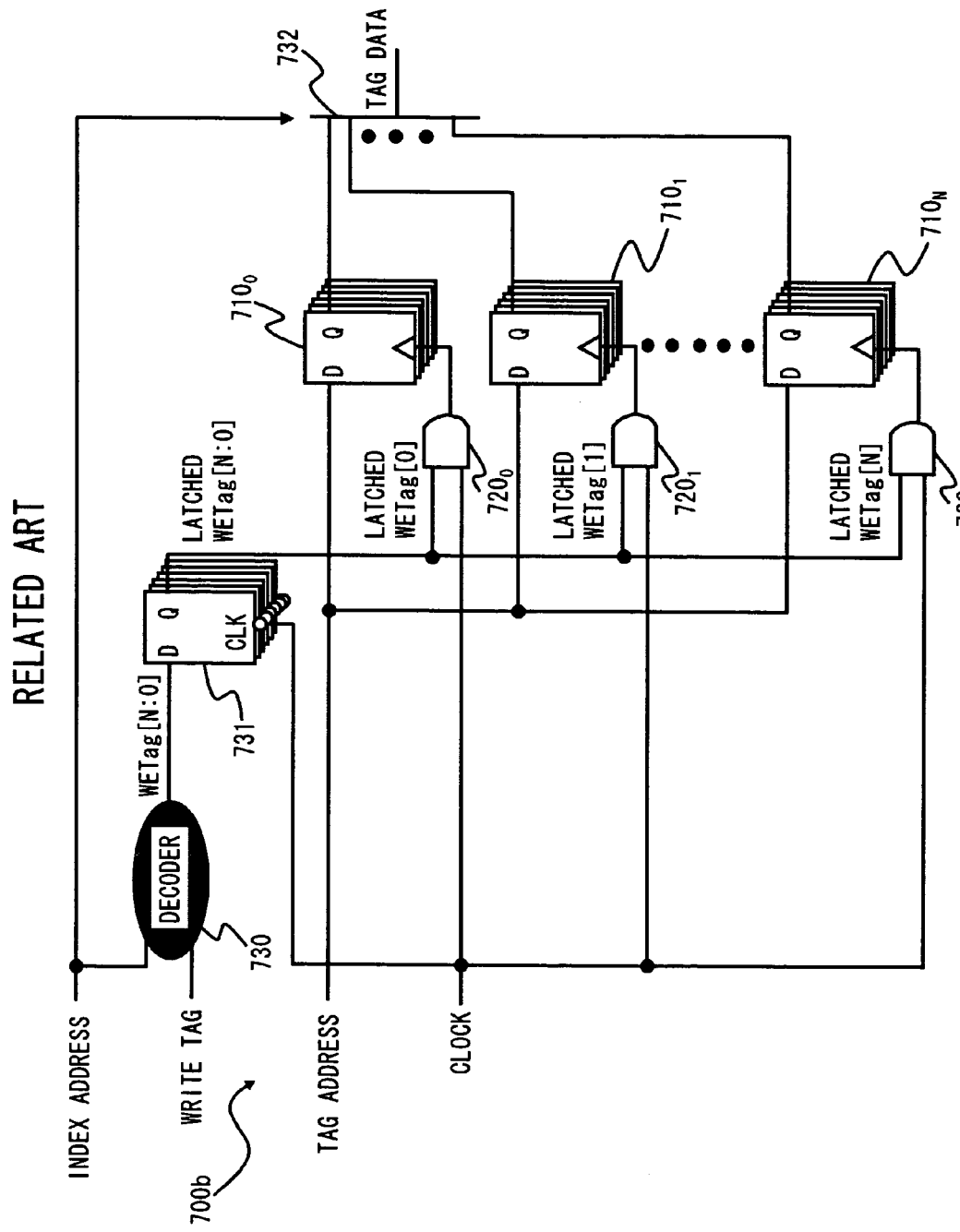
FIG. 7B shows a conventional tag memory using a flip flop.
Figure 8A:
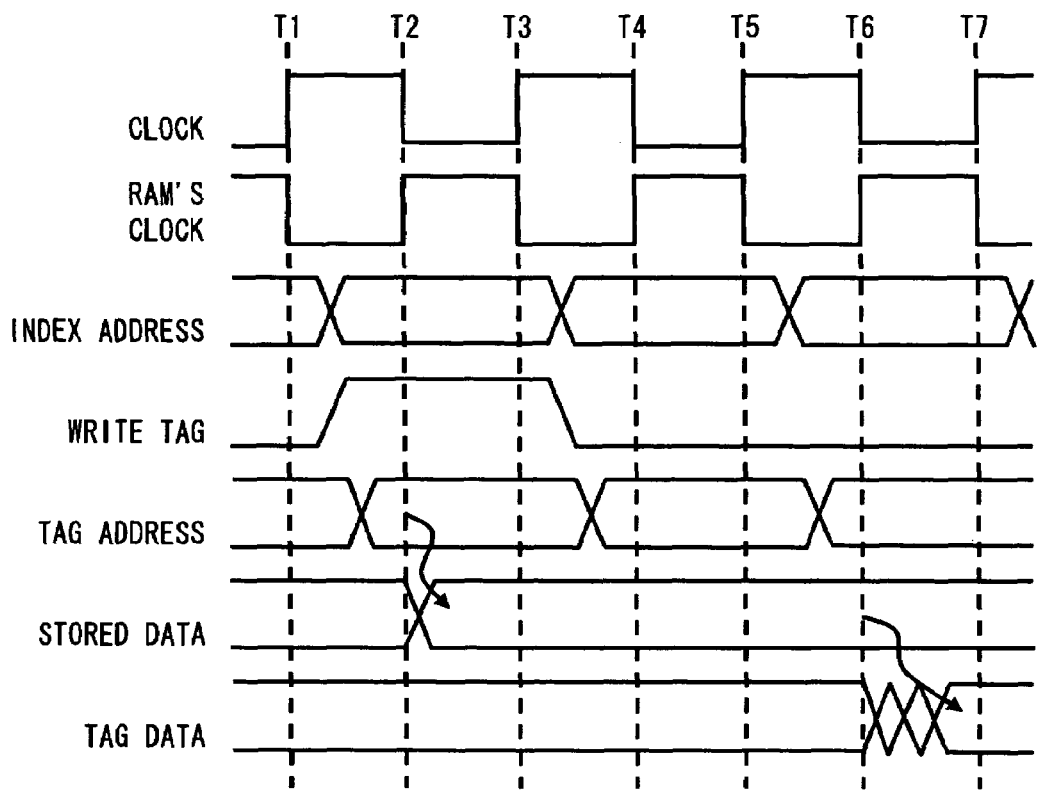
FIG. 8A is a timing chart of operations of the conventional SRAM used as the tag memory.
Figure 8B:
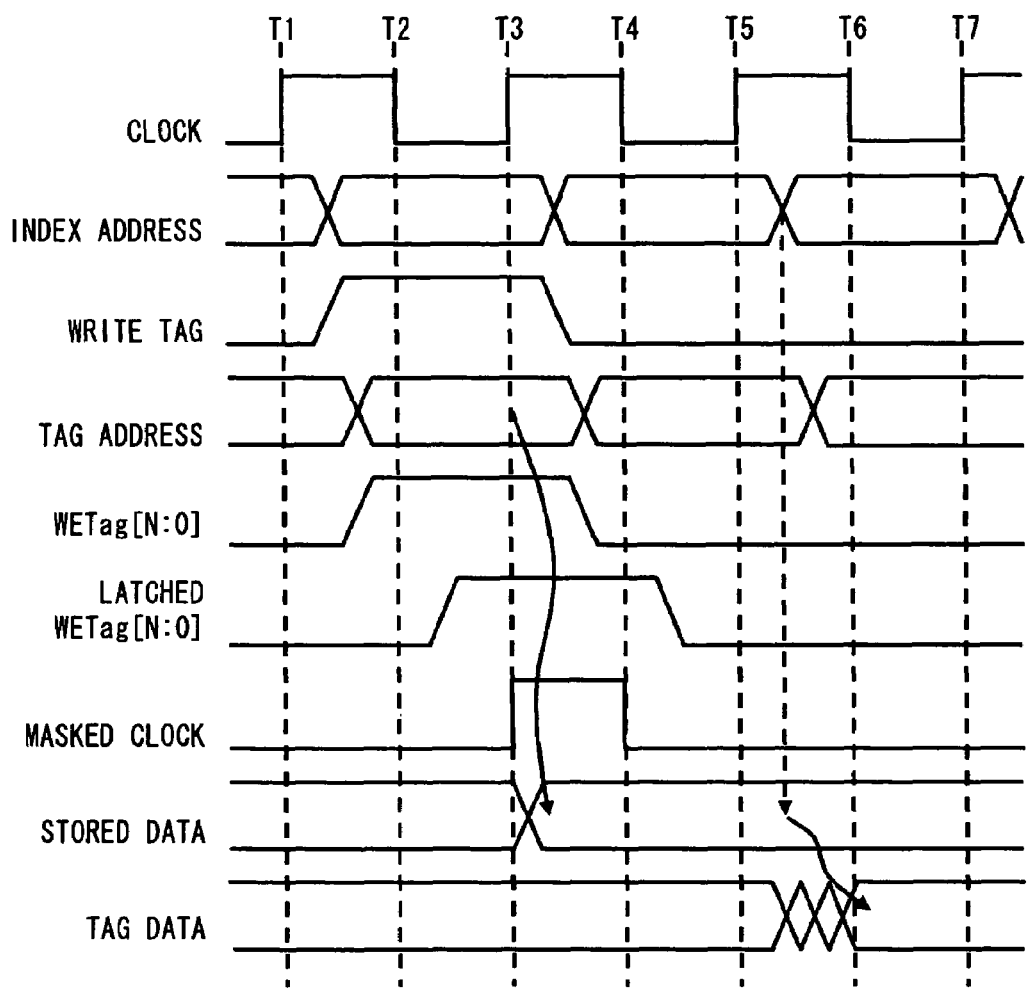
FIG. 8B is a timing chart of operations of the conventional tag memory using a flip flop.

FIG. 5 is a timing chart of operations of the tag memory 400 according to the second embodiment. First, an operation of writing the tag address data is described. As shown in FIG. 5, the WriteTag signal is shifted to a data write level during a period from the timing T1 to the timing T2. After that, during a period from the timing T2 and the timing T3, the D latch n410 outputs the Latched Index address data, and the D latch n411 generates the Latched WriteTag signal. The Latched Index address data and the Latched WETag [N:0] signal are held until when the falling edge of the clock appears during a period from the timing T2 to the timing T4.

Further, the input tag address data is output from the D latch n232 on the falling edge of a clock at the timing T2. The output data is input to the D latches p210 as the Latched tag address data. The Latched tag address data is held until when the falling edge of a clock appears during a period from the timing T2 to the timing T4.

When the clock rises at the timing T3, the AND gate 220 designated by the above Latched WETag [N:0] signal outputs a Masked clock. The D latch p210 connected with the designated AND gate 220 starts outputting the Latched tag address data determined at the timing T3, on the rising edge of the Masked clock, and stores the Latched tag address data just before the falling edge of the clock at the timing T4.

Further, a reading operation of the tag memory 400 of the second embodiment is the same as the tag memory of the first embodiment, so its description is omitted.

Also in the tag memory of the second embodiment, similar to the tag memory of the first embodiment, a selection signal is generated based on the Index address data and the WriteTag signal, whereby a desired one is selected from the D latches p210, and the tag address to be sent to the latch circuit 203 can be output. Hence, substantially the same operating speed as that of the tag memory of the first embodiment can be realized. Further, the tag memory of the second embodiment only has the D latch n410 in addition to the components of the tag memory of the first embodiment l⊏D latch n410. Thus, the footprint of the tag memory of the second embodiment is substantially the same as the footprint of the tag memory of the first embodiment.

It is apparent that the present invention is not limited to the above embodiment that may be modified and changed without departing from the scope and spirit of the invention. According to the present invention, the tag memory is composed of a pair of D latch p and D latch n. Hence, a size of a memory adopted is insignificant. For example, the present invention is applicable to a valid bit memory or a dirty bit memory that stores one-bit data, and to a tag memory of a main memory. Further, the present invention can be accomplished even with inverted logic to the above embodiments.

It is apparent that the present invention is not limited to the above embodiment that may be modified and changed without departing from the scope and spirit of the invention.

What is claimed is:

1. A semiconductor storage device, comprising:
a first latch circuit for latching stored data; and
a storage cell part including a plurality of second latch circuits, each of the plurality of second latch circuits having a single latch circuit, said plurality of second latch circuits configured to operate with inverted logic from the first latch circuit, and to receive the stored data from the first latch circuit to output the received data using a selected one of the plurality of second latch circuits, said second latch circuit being selected in accordance with a selection signal.

2. The semiconductor storage device according to claim 1, further comprising a selection signal generating circuit for generating the selection signal.

3. The semiconductor storage device according to claim 2, wherein the selection signal generating circuit further comprises:
a decoder for generating an asynchronous selection signal for selecting the second latch circuit, which changes not in sync with a clock supplied to the semiconductor storage device, based on designating data for designating the second latch circuit for storing the stored data, and a control signal for controlling a data write state of the second latch circuit; and
a third latch circuit that operates at the same frequencies as the first latch circuit, and latches the asynchronous selection signal in sync with the clock to generate the selection signal.

4. The semiconductor storage device according to claim 3, further comprising a multiplexer for selecting data output from the second latch circuit designated based on the designating data, and outputting the selected data.

5. The semiconductor storage device according to claim 2, wherein the selection signal generating circuit further comprises:
a fourth latch that operates at the same logic as the first latch circuit, and latches designating data for designating the selected second latch circuit;
a fifth latch circuit that operates at the same frequencies as the first latch circuit, and latches a control signal for controlling a data write state of the second latch circuit; and
a decoder for generating the selection signal based on data output from the fourth latch circuit and the fifth latch circuit.

6. The semiconductor storage device according to claim 5, further comprising a multiplexer for selecting data output from the second latch circuit designated based on the designating data, and outputting the selected data.

7. The semiconductor storage device according to claim 2, wherein the selection signal generating circuit further comprises a fourth latch that operates at the same logic as the first latch circuit, and latches designating data for designating the selected second latch circuit.

8. The semiconductor storage device according to claim 2, wherein the selection signal generating circuit a fifth latch circuit that operates at same frequencies as the first latch circuit and latches a control signal for controlling a data write state of the second latch circuit 9. The semiconductor storage device according to claim 2, wherein the selection signal generating circuit further comprises a decoder for generating the selection signal based on data output from a fourth latch circuit configured to latch designating data for designating the selected second latch circuit and a fifth latch circuit that operates at same frequencies as the first latch circuit and latches a control signal for controlling a data write state of the second latch circuit.

10. The semiconductor storage device according to claim 1, further comprising a gate circuit for generating a second clock signal supplied to the second latch circuit based on the selection signal and a first clock signal supplied to the first latch circuit.

11. The semiconductor storage device according to claim 1, further comprising a latched selection signal latched in sync with a clock.

12. The semiconductor storage device according to claim 1, wherein the second latch circuit comprises an input terminal, and
wherein the storage cell generates a masked clock according to AND gates, a clock signal, and said latched selection signal.

13. The semiconductor storage device according to claim 12, wherein when the clock signal is at a low level, the second latch circuit outputs the selection signal input to the input terminal as the latched selection signal.

14. The semiconductor storage device according to claim 12, wherein when the clock signal is at a high level, the second latch circuit holds the selection signal input to the input terminal as the latched selection signal before the clock turns to the high level.

15. The semiconductor storage device according to claim 12, wherein the AND gates comprise:
a first input terminal to receive the latched selection signal;
a second input terminal to receive the clock signal; and
an output terminal.

16. The semiconductor storage device according to claim 1, further comprising a third latch circuit that operates at same frequencies as the first latch circuit, and latches the asynchronous selection signal in sync with a clock to generate the selection signal.

17. The semiconductor storage device according to claim 1, wherein the selection signal generating circuit further comprising a decoder for generating an asynchronous selection signal for selecting the second latch circuit, which changes not in sync with a clock supplied to the semiconductor storage device, based on designating data for designating the second latch circuit for storing the stored data, and a control signal for controlling a data write state of the second latch circuit.

18. A semiconductor storage device, comprising:
a first latch circuit for latching writing data; and
a storage cell part including a plurality of second latch circuits, each of the plurality of second latch circuits having a single latch circuit, that operate with inverted logic from the first latch circuit, and receives the writing data from the first latch circuit to output the received data using a selected one of the plurality of second latch circuits, said selected second latch circuit being selected in accordance with a selection signal.

19. A cache memory including a semiconductor storage device, comprising:
a data memory;
a first memory for storing tag data;
a second memory for storing data about whether or not data in the data memory is valid;
a third memory for storing data about whether or not the data in the data memory is changed, the first, second, and third memories being provided in the semiconductor storage device and at least one of the first, second, and third memories including:
a first latch circuit for latching stored data to be stored in the at least one of the first, second, and third memories; and
a storage cell part including a plurality of second latch circuits, each of the plurality of second latch circuits having a single latch circuit, said second latch circuits configured to operate with inverted logic from the first latch circuit, and receives the stored data from the first latch circuit to output the received data using a selected one of the plurality of second latch circuits, said selected second latch circuit being selected in accordance with a selection signal.

* * * * *